United States Patent [19]

Nakase et al.

[11] Patent Number: 4,792,923
[45] Date of Patent: Dec. 20, 1988

[54] BIPOLAR SEMICONDUCTOR MEMORY DEVICE WITH DOUBLE WORD LINES STRUCTURE

[75] Inventors: Yasunobu Nakase; Kenji Anami, both of Itami, Japan

[73] Assignee: Mitsubishi Denki Kabushiki Kaisha, Tokyo, Japan

[21] Appl. No.: 901,745

[22] Filed: Aug. 29, 1986

[30] Foreign Application Priority Data

Aug. 30, 1985 [JP] Japan .................................. 60-192522
Feb. 7, 1986 [JP] Japan .................................. 61-26261
May 31, 1986 [JP] Japan .................................. 61-126492

[51] Int. Cl.$^4$ ........................ G11C 7/00; G11C 11/40
[52] U.S. Cl. .................................. 365/154; 365/155; 365/189; 307/317 A
[58] Field of Search ............... 365/189, 190, 154, 155, 365/230; 307/317 A

[56] References Cited

U.S. PATENT DOCUMENTS

| | | | |
|---|---|---|---|
| 4,125,877 | 11/1978 | Reinert ............... | 365/190 |
| 4,598,390 | 7/1986 | Chan .................. | 365/230 |
| 4,627,034 | 12/1986 | Herndon .............. | 365/226 |
| 4,654,824 | 3/1987 | Thomas et al. ....... | 365/175 |

OTHER PUBLICATIONS

"A 15ns 16Kb ECL RAM with a PNP Load Cell", by K. Toyoda et al, IEEE International Solid-State Circuits Conference, 2/24/83, pp. 108-109.
"A 15ns 64K Bipolar SRAM", by R. Heald et al, 1985 IEEE International Solid-State Circuits Conference, 2/13/85, pp. 50-51 and 304.
"A 4.5ns Access Time 1K×4 Bit ECL RAM", J. Nokubo et al, IEEE Journal of Solid-State Circuits, vol. SC-18, No. 5, Oct. 1983, NEC, pp. 515-519.

Primary Examiner—Stuart N. Hecker
Assistant Examiner—Alyssa H. Bowler
Attorney, Agent, or Firm—Birch, Stewart, Kolasch & Birch

[57] ABSTRACT

A semiconductor memory device having a plurality of word line pairs and drain lines, a plurality of bit line pairs, and a plurality of memory cells connected to both of the word line pairs and the bit line pairs at the cross points thereof, comprising: a first and a second word line provided as the word line pair, a memory cell including a first and a second multi-emitter transistor whose commonly connected emitters are connected to the drain line, first and second resistors where one of their ends are connected between the collectors of the first and second multi-emitter transistors respectively, and where their other ends are both connected to the first word line and the bases of the second and first multi-emitter transistors are connected to the other's collectors, respectively, and first and second diodes such as Schottky barrier diodes are connected between the collectors of the first and second multi-emitter transistors and the second word line, respectively. A current which is provided for each row which consists of an input transistor which receives an address input signal at its base input and a reference transistor which receives a predetermined voltage at its base input with the emitters thereof being commonly connected with each other. Third and fourth resistors are serially connected between the collector of the input transistor and a power supply voltage. A first word line driving transistor for driving the first word line whose base is connected between the third resistor and the fourth resistor and whose emitter is connected to the first word line. A second word line driving transistor for driving the second word line whose base is connected between the collector of the input transistor and the fourth resistor and whose emitter is connected to the second word line. The collectors of the first and the second word line driving transistor are connected to the voltage power supply.

14 Claims, 5 Drawing Sheets

BIPOLAR SEMICONDUCTOR MEMORY DEVICE WITH DOUBLE WORD LINES STRUCTURE

FIELD OF THE INVENTION

The present invention relates to a semiconductor memory device, and more particularly to a random access memory using bipolar transistors.

BACKGROUND OF THE INVENTION

Figure 6:
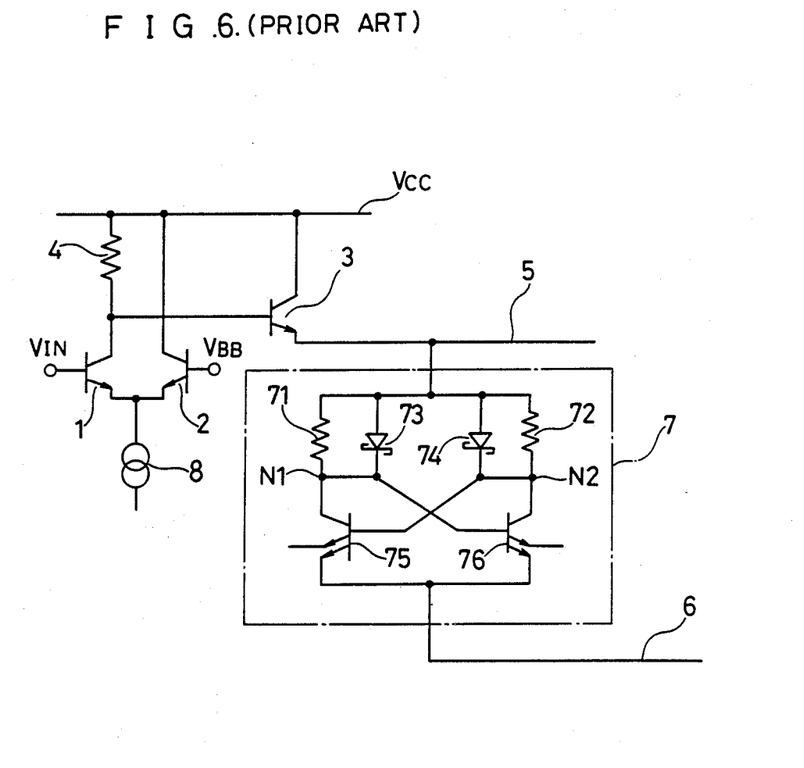
FIG. 6 is a diagram showing a word line driving circuit of a prior art semiconductor memory device.

FIG. 6 shows a prior art semiconductor memory device. In FIG. 6 only necessary portions are illustrated for simplification. In FIG. 6, the reference numerals 1 and 2 designate transistors constituting a current switch for switching a current in accordance with the voltage of an address signal V IN which is from the previous stage. The reference character V BB designates a reference voltage, and this is set at an intermediate voltage in the range of the voltage swing V IN. The reference numeral 4 designates a resistor, and the reference numeral 8 designates a current source. The reference numeral 3 designates a transistor for driving word line 5. This transistor 3 makes the voltage of word line 5 low or high in accordance with the voltage V IN being high or low. The numeral 7 designates a Schottky barrier diode (hereinafter referred to as "SBD") clamping memory cell. A plurality of memory cells are connected to each word line, and the memory cells include two multi-emitter transistors 75 and 76. An inverter is cconstructed with the multi-emitter transistors and the collector load consists of a load resistor (71 or 72) connected in parallel with an SBD (73 or 74). The memory cells consist of flip-flops characterised by two cross-coupled inverters. Stored data in the memory cells are discriminated by voltage differences between nodes N1 and N2, and the voltage difference is referred to as memory cell voltage swing. The reference numeral 6 designates a drain line. In order to hold the stored data, this drain line 6 is connected to a current source (not shown) so that a current (current value IH) is always taken out from each memory cell. The reference character V CC designates a power supply voltage.

The device will be operated as follows.

When the address output signal voltage V IN is higher than the reference voltage V BB, the transistor 1 is turned on, and the base voltage of the word line driving transistor 3 becomes lower than the power supply voltage V CC by the voltage of a product of the current of the current source 8 and the resistance of the resistor 4. The voltage of word line 5 is further lowered by the base emitter voltage V BE of the transistor 3. This state is referred to as a word line non-selected state.

On the other hand, when the address output signal voltage V IN is lower than the reference voltage V BB, the transistor 2 is turned on, and the base voltage of the word line driving transistor 3 rises up to about the power supply voltage V CC. Then, the voltage of the word line 5 is higher than that of the non-selected word line state. This is referred to as a selected word line state. The word line voltage in this state is V CC−V BE.

In the non-selected word line state, the memory cell voltage swing is determined by the following. If it is presumed hhat the transistors 75 and 76 of the memory cell 7 are in an ON and OFF state, respectively, the voltage of the node N2 is equal to that of word line 5. On the contrary, the voltage of the node N1 becomes lower than that of the word line by a value of IH·RL because almost all the memory holding current IH flows through the load resistance 71. Accordingly, the memory cell voltage swing is IH·RL.

In the prior art semiconductor memory device with such a construction, the memory cell voltage swing at the non-selected word line state cannot be made larger than a predetermined value, and accordingly the data in the memory is likely to be inverted by induced electron-hole pairs which are generated by α rays incident to the memory cell.

The likelihood of the inversion of the stored daa due to α rays is inversely proportional to the memory cell voltage swing. Accordingly, in order to prevent the inversion of the stored data the memory cell voltage swing is to be made large enough but for that purpose the memory holding current or the load resistance of the memory cell must be made large. However, in either case there are the following restrictions.

First of all, the memory data holding current in the memory cell unselected state cannot be made as large because of the restriction in the power consumption. The upper limit is IH=30 to 60 μA for one having a memory capacity of 1K bits, and IH=10 to 15 μA for one having a memory capacity of 4K bit. In the holding current of such a degree, the upper limit of the possible memory cell voltage swing is limited to 0.4 to 0.5 V. Although the load resistances 71 and 72 of the memory cell can be made larger in order to increase the voltage swing, when the voltage swing becomes likely to be larger than 0.4 to 0.5 V the current flowing through the load resistance is decreased because the SBD is turned ON then, and it is impossible to obtain a voltage difference larger than the forward voltage drop of the SBD (0.4 to 0.5 V) in the holding current range above.

On the contrary, in the selected word line state a larger current other than the stored data holding current can be taken out from the memory cell by another current source, whereby a current flowing through the SBD connected to the collector of the ON side transistor of the memory cell is increased, and the forward voltage drop is also increased. It is usual in the state of the art that a larger current is taken out from the word line in the selected state, an increase of the current can be small enough compared to the case in which the data holding current is increased because the increase of the former relates only to one word line, the latter relates to all the word lines. Accordingly, the memory cell voltage swing can be made large, and the inversion rate of the stored data due to α rays is decreased to a negligible extent with relative to the non-selected state. Accordingly, in order to prevent the inversion of the stored data due to α rays, it is necessary to increase the memory cell voltage swing at the non-selected word line state.

SUMMARY OF THE INVENTION

An object of the present invention is to provide a semiconductor memory device capable of preventing the inversion of the stored data due to α rays.

A second object of the present invention is to provide a semiconductor memory device capable of improving the anti-soft error intensity of the memory cell.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor memory device having a plurality of word line pairs and drain lines, a plurality of bit line pairs, and a plurality of memory cells connected to the word line pairs and the bit line pairs at the cross points. The device comprising: first and second word lines being provided as each word line pair; each memory cell including first and second multi-emitter transistors whose commonly connected emitters are connected to the drain lines, first and second resistors where one of their ends are connected to the collectors of the first and second multi-emitter transistors, respectively, and where their other ends are connected to the first word line, the bases of the second and first multi-emitter transistors are connected to the other's collectors, and a first and a second diode such as a Schottky barrier diode which are connected between the collectors of the first an second multi-emitter transistors and the second word line, respectively. A current switch is provided which consists of an input transistor which receives an address input signal at its base input and a reference transistor which receives a predetermined voltage at its base input with the emitters thereof being commonly connected with each other to a current source. A third and a fourth resistor are provided and are serially connected between the collector of the input transistor and a power supply voltage. A first word line driving transistor for driving the first word line whose base is connected to the connection node of the third resistor and the fourth resistor and whose emitter is connected to the first word line. A second word line driving transistor for driving the second word line whose base is connected to the connection node of the collector of the input transistor and the fourth resistor, and whose emitter is connected to the second word line. The collectors of the first and second word line driving transistors are connected to the power supply voltage.

DETAILED DESCRIPTION OF THE PREFERRED EMBODIMENTS

Figure 1:
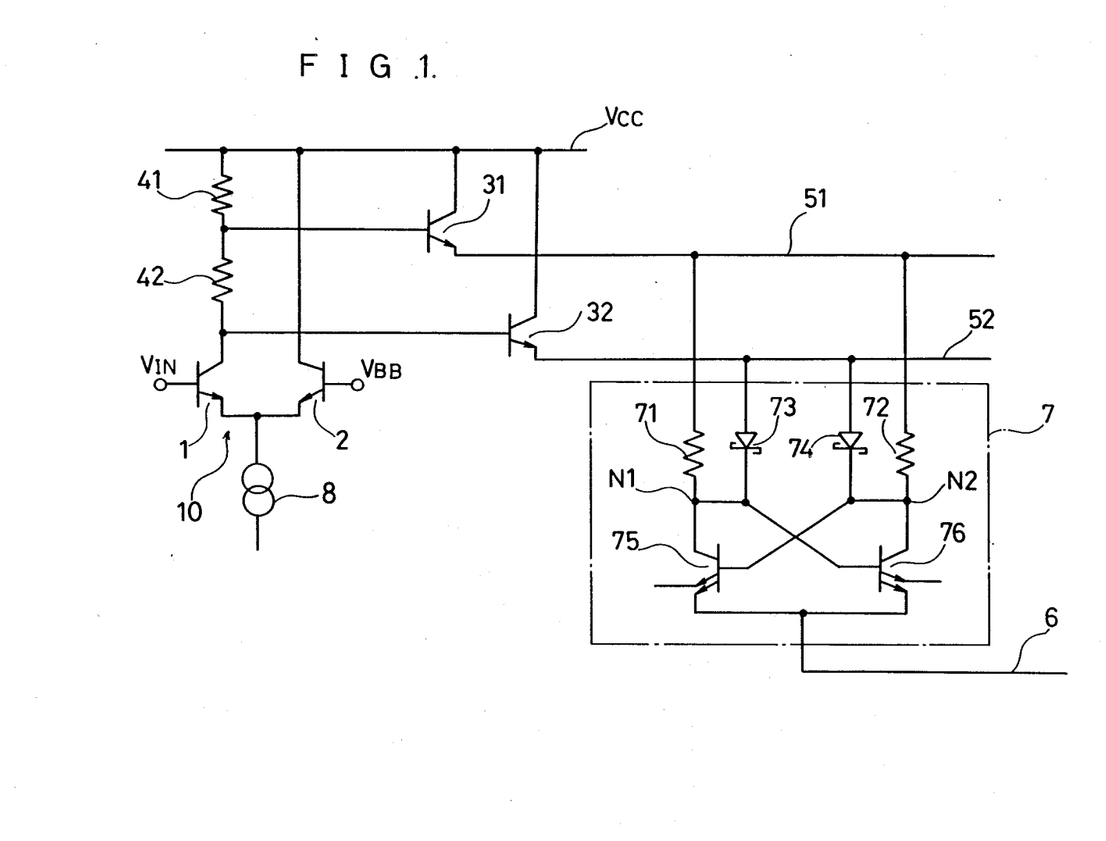
FIG. 1 is a diagram showing a word line pair driving circuit of a semiconductor memory device as a first embodiment of the the present invention.

In order to explain the present invention in detail, reference will be particularly made to FIG. 1.

FIG. 1 shows a semiconductor memory device as an embodiment of the present inventoon. In FIG. 1 the same reference numerals designate the same elements as those shown in the prior art device.

The collector of the transistor 1 consists of a current switch 10 which is connected to the power supply voltage V CC through a third and a fourth resistor 41 and 42. The base of the first transistor 31 for driving the first word line is connected between resistors 41 and 42. The base of the second word line driving transistor 32 is connected between the collector of the transistor 1 and the resistor 42.

The first and second load resistors 71 and 72 of each memory cell 7 arranged on the same row are connected to the emitter of the first word line driving transistor 31 through a first word line 51, and the first and the seoond SBDs 73 and 74 are both connected to the emitter of the second word line driving transistor 32 through a second word line 52.

The device will be operated as follows.

When the address output signal voltage V IN is lower than the reference voltag V BB, a current from the current source 8 (having a value I) is supplied through the transistor 2, and the word lines 51 and 52 become the selected states. Then, the current does not flow through the transistrr 1, and the base voltage of the word line driving transistors 31 and 32 are equal to the power supply voltage V CC. Accordingly, the voltages of the word lines 51 and 52 become equal to each other, and the device will be operated in the same manner as the prior art circuit at the selected word line state.

On the other hand, when the address output signal voltage V IN becomes higher than the reference voltage V BB and the word line pair is not selected, a voltage difference of I·R2 is generated between the word lines 51 and 52. Herein, R2 designates the resistance value of the resistor 42. Now suppose that the transistors 75 and 76 of the memory cell are in an ON and an OFF state, respectively, and further that the forward voltage drop of the SBD at which the SBD begins to be turned ON when the memory holding current is taken out from the memory cell is VF. In this case VF is about 0.4 to 0.5 V.

Contrary to the memory cell voltage swing in the prior art device is VF at maximum as described above, it is possible to obtain a maximum voltage swing of (VF+I·R2) in the present invention. The reason is as described below.

First of all, it is possible to apply a voltage VF at maximum between the word line 52 and the node N1. It is possible to obtain a voltage (VF+I·R2) at a maximum as the maximum voltage difference between the word line 51 and the node N1, because the voltage of the word line 51 is higher than that of the word line 52 by I·R2. Frthermore, the voltage of the node N2 is equal to that of the word line 51 because the transistor 76 is in an OFF state. Accordingly, the memory cell voltage swing at the non-selected word line state becomes (VF+I·R2), and this can be made an arbitrary value by determining the current I of the current source and the resistance value of the resistor 42 properly.

In this embodiment, it is possible to establish the mmmory cell voltage swing at a larger value than that of the prior art device in the non-selected word line state, whereby the inversion of the stored data due to α rays which is likely to arise in the non-selected word line state can be prevented.

However the device of FIG. 1 has the following drawbacks.

The object of the device of FIG. 1 is to enhance the anti-soft error intensity by means of increasing the memory cell voltage swing. However, in this circuit of FIG. 1, although the memory cell voltage swing in the non-selected word line state is improved to a great extent, the memory cell voltage swing in the selected word line state is not improved relative to the circuit of FIG. 6, thereby resulting in the weakness against the soft errors in the selected word line state.

Figure 2:
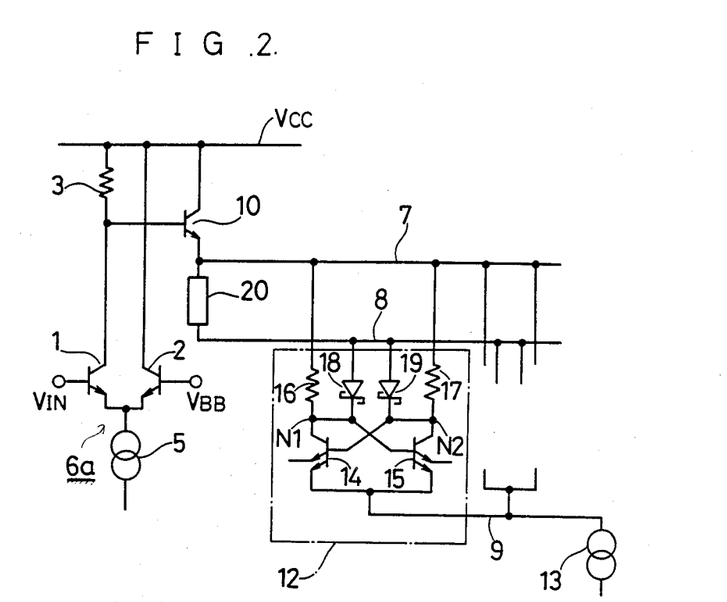
FIG. 2 is a diagram showing a word line pair driving circuit of a semiconductor memory device as a second embodiment of the present invention.

FIG. 2 shows a second embodiment of the present invention which aims at improving the anti-soft error intensity. The differences between this second embodiment and the first embodiment of FIG. 1 will be described.

Only a resistor 3 is used as a collector load resistor of the first transistor 1 consisting of a current switch 6a, and the base of the third transistor 10 fo driving the first word line 7 is directly connected to the collector of the first transistor 1. The second word line 8 is also driven by the third transistor 10 through a word line load 20. The fourth word line driving transistor of FIG. 1 is removed. The reference numeral 13 designates a current source which is connected to the drain line 9. Otherwise, each element has the same function as that of FIG. 1 even if it has a different reference numeral.

Figure 3:
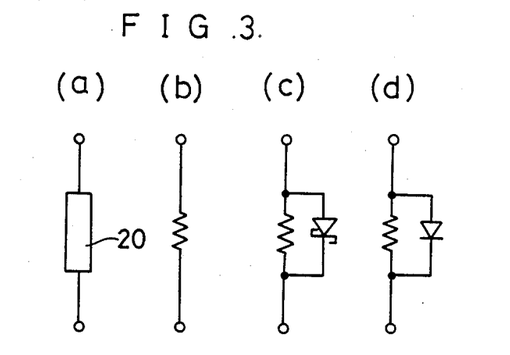
FIGS. 3(a), 3(b), 3(c) and 3(d) are diagrams showing alternative loads of the circuit of the second embodiment of the present invention.

As the word line load 20, various kinds of loads shown in FIG. 3 can be used. But in the following, a resistor shown in FIG. 3(b) having a resistance value of $R_{WL}$ is used as the word line load 20 of FIG. 3(a). FIG. 3(c) shows a load obtained by connecting a resistor and a SBD in parallel with each other, and FIG. 3(d) shows a load obtained by connecting a resistor and a PN diode in parallel with each other.

The device will be operated as follows.

(A) In the non-selected word line state:

The voltage difference between the nodes N1 and N2 of the memory cell 12 must be larger than VF in order that the SBD 18 or 19 of the memory cell 12 may be turned ON. Now suppose that the transistor 14 among the transistors 14 and 15 of the memory cell 12 is in an ON state. That is, the node N1 is at a low level, and the node N2 is at a high level. Now suppose that the SBD 18 is in an ON state, and a current $I_F(I_F<I_H)$ is flowing therethrough. When the number of memory cells connected to each word line is m, the current flowing through the word line load 20 is m·$I_F$, and therefore the voltage difference between the first word line 7 and the second word line 8 becomes m·$I_F$·$R_{WL}$. Then, the memory cell voltage swing becomes ($V_F$+m·$I_F$·$R_{WL}$), and it can be made ($V_F$+m·$I_H$·$R_{WL}$) at maximum, thereby being able to obtain a voltage swing larger than the clamping voltage $V_F$ of the SBD similarly as in the prior art device of FIG. 1. The actual voltage swing can be determined arbitrarily in the range restricted by the above-mentioned upper limit by adjusting the load resistance $R_L$ of the memory cell 12 and the resistance $R_{WL}$ of the word line load 20.

(B) In the selected word line state:

A reading out current ($I_{RW}$) flows through the transistor 14 or 15 from at least one of the memory cells connected to the selected word line (hereinafter referred to as "selected memory cell") to the bit line which is not shown. In a case of a memory cell having a memory capacity of 4K bits, $I_{RW}$ is about 1 mA for a selected memory cell, and m·$I_H$ is also about 1 mA. Because $I_{RW}$ is quite large as described above, almost all portions thereof flow through the SBD of the memory cell. Accordingly, the current flowing through the word line load 20 is $I_{RW}$ at minimum, and the memory cell voltage swing in the selected word line state becomes ($I_{RW}$·$R_{WL}$+$V_F$) at minimum.

By the way, in the selected memory cell, when the transistor which supplies $I_{RW}$ is saturated, the writing in time is especially lengthened. In order to prevent the saturation of the transistor, the high level of the selected memory cell needs to be lowered, or the low level of the selected memory cell needs to be higher. When the corresponding word line is selected and the memory cell is selected, the base current of the transistor which supplies $I_{RW}$ is increased to a non-negligible extent, and the high level of the memory cell is lowered. When the current gain of the memory cell transistor is $h_{FE}$, and the decrease in the high level of the selected memory cell is $\Delta V_H$, $$R_L \cdot I_{RW}/h_{FE} \, \Delta V_H < V_F$$

Although $R_{WL}$ needs to have a value of several kΩ in order to increase the voltage swing in the non-selected word line state, if $I_{RW}$ is made equal to 1 mA, then in the selected word line state the voltage of the second word line is lowered by several volts relative to the first word line. On the other hand, the $\Delta V_H$ of the selected memory cell is only expected to have a value a little less than 1 V, therefore the memory cell transistor is completely saturated.

In order to prevent the low level from being lowered by more than required in the selected memory cell, a circuit of FIG. 3(c) can be used. In this case, the voltage difference between the first word line and the second word line in the selected state does not become larger than $V_F$ of the SBD, and the saturation of the memory cell transistor can be prevented. That is, the low level of the selected memory cell $V_L$ becomes relative to the first word line $$V_L = -2V_F,$$

and the high level thereof $V_H$ becomes $$V_H = -R_L \, I_{RW}/h_{FE} \, (> -2V_F),$$

and therefore it is possible to prevent the saturation by determining the $R_L$ properly.

FIG. 3(d) shows a circuit obtained from a similar point of view, and a PN diode is used instead of the SBD. In this case it is possible to reduce the design pattern area with relative to the case using the circuit of FIG. 3(c).

The load inserted between the first word line and the second word line needs only to have a function for generating a constant voltage drop when a current flows therethrough, and it is not limited to those shown in FIG. 3.

As described above, the object of the device of FIG. 1 is to enhance the anti-soft error intensity by means of increasing the voltage swing of the memory cell 7. In a circuit construction shown in FIG. 6, the voltage swing of the memory cell 7 is smaller in the word line non-selected state than in the selected word line state, and soft errors arise more likely in the memory cell which are connected to the non-selected word line. The circuit construction of FIG. 1 is adopted to improve the voltage swing of the memory cells connected to the non-selected word line pairs 51 and 52 to a great extent. However, in this circuit of FIG. 1, the voltage swing of the memory cell 7 in the word line selected state is not improved with relative to the circuit of FIG. 1, and this results in concentrated occurences of soft errors in the memory cells of the selected word line state.

Figure 4:
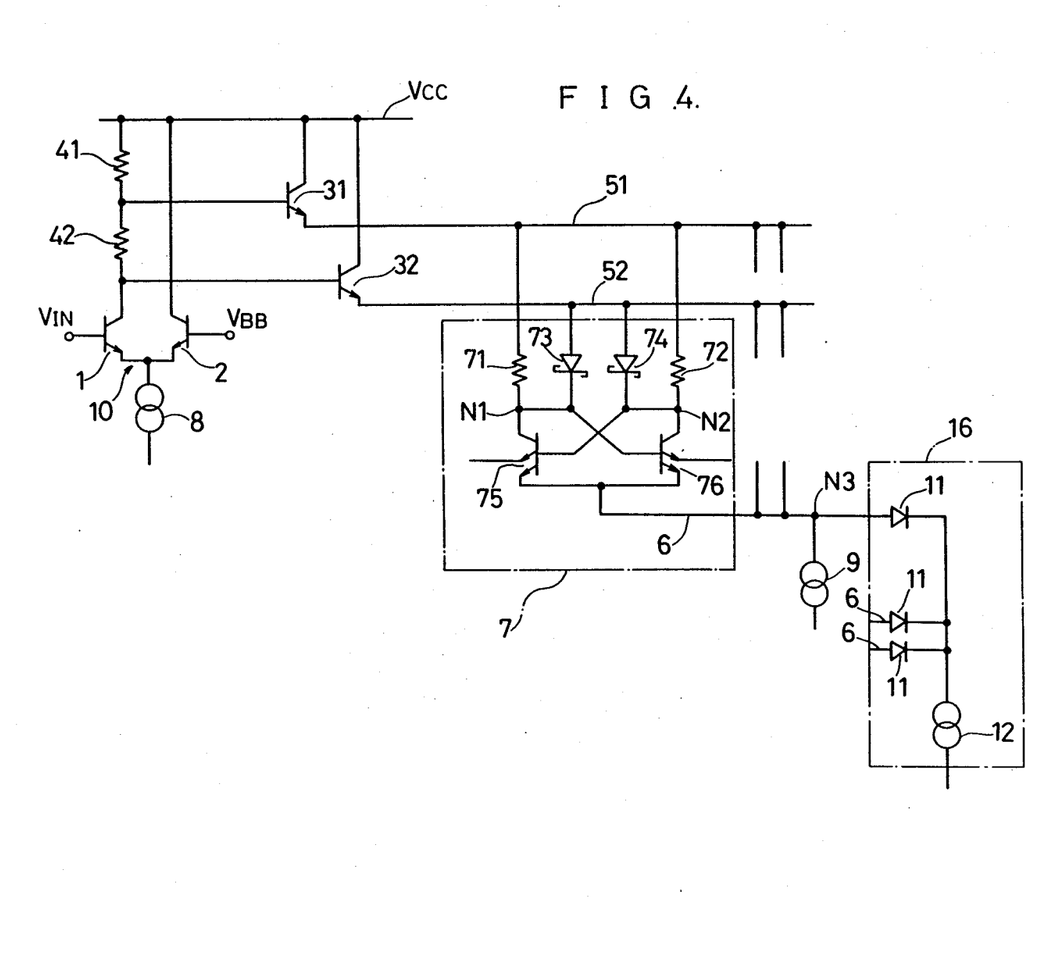
FIG. 4 is a diagram showing a word line pair driving circuit of a semiconductor memory device as a third embodiment of the present invention.

FIG. 4 shows a third embodiment of the present invention. The differences between the construction of this third embodiment (FIG. 4) and the first embodiment (FIG. 1) will be described. A diode 11 is connected with the drain line 6 of each row, and the drain lines are commonly connected to a current source 12 through these diodes. That is, in this embodiment the diodes provided at each row and the current source 12 constitute current extracting means 16 for extracting a predetermined current from the memory cells which are connected to the drain line 6 which is at the highest voltage level among the drain lines.

The device will be operated as follows.

Now suppose that the first and the second word lines 51 and 52 are selected. Then, the voltage of the node N2 of the memory cell which has a higher voltage is equal to the voltage of the word line 51 or 52 because the memory cell transsstor 76 is not turned ON. However, a base current of the ON transistor 75 flows through the second resistor 72 and the SBD 74, and the voltage of the node N2 becomes a little lower than that of the word lines. Then, the drain line 6 corresponding to the selected word lines 51 and 52 is at a higher voltage than those of the drain lines of the other non-selected rows. Accordingly, the voltage of the node N3 of the selected row is higher than those of the corresponding nodes N3 of the non-selected rows, and the current of the current source 12 is supplied from the drain line 6 to which the selected memory cell is connected. This means that the current of the current source 12 is supplied from each memory cell connected to the drain line 6 to which the selected memory cell is connected. The fact that the current flowing through each memory cell 7 of the selected row increases means that the current flowing through the SBD 73 connected to the collector of the ON transistor 75 of each memory cell 7 increases, and when the current flowing through the SBD 73 increases the forward voltage drop thereof is also increased, and in each memory cell 7 of the selected row the voltage of the node N1 which has a lower voltage is further lowered. Accordingly, the voltage swing of all the memory cells connected to the selected word lines 51 and 52 are increased, and the anti-soft error intensity of the memory cells connected to the selected word lines 51 and 52 are also improved. The value of the current flowing through the memory cell connected to the selected word lines 51 and 52 can be ariitrarily determined by adjusting the current of the current source 12.

In this third embodiment, current extracting means 16 may be any type if it has only a function to extract a current from the drain line 6 corresponding to the selected word lines 51 and 52.

Figure 5:
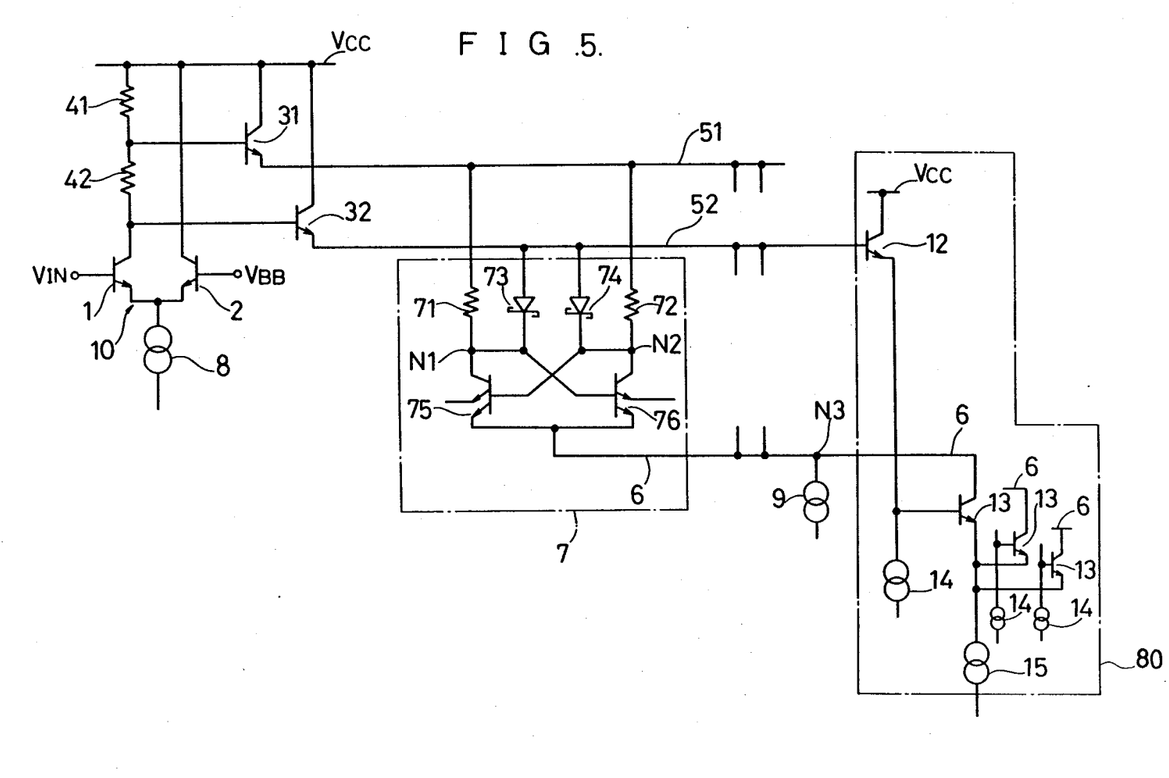
FIG. 5 is a diagram showing a word line pair driving circuit of a semiconductor memory device as a fourth embodiment of the present invention.

FIG. 5 shows a fourth embodiment of the present invention which has a different type of current extracting means.

The current extaacting means 80 of this embodiment comprises first and second current extracting transistors 12 and 13 and a first current source 14 provided at each row, and a second current extracting current source 15. The base input of the first current extracting transistor 12 provided at each row is connected to the second word line 52, the emitter thereof is connected to the first current extracting current source 14 provided at that row, and the collector thereof is connected to the power supply voltage Vcc. The base input of the second current extracting transistor 13 provided at each row is connected to the emitter of the transistor 12 of that row, the collector thereof is connected to the drain line 6, and the emitter thereof is connected to the second current extracting current source 15 which is provided commonly through all the word lines.

In such a construction, the selected word lines and the drain line have higher voltages than the other corresponding word lines of non-selected rows, and the emitter voltage of the first current extracting transistor 12 of the selected row whose base is connected to the selected second word line 52 is highest voltage. By this, the second current extracting transistor 13 of the selected row is turned ON, and thss a current is extracted from the drain line 6 corresponding to the selected word lines by the second current source 15.

In the above-illustrated embodiments, a SBD clamping memory cell is used, but a memory cell using PN diodes instead of SBDs can be effectively used.

In the illustrated embodiments, a resistor having a high resistance is used as a load of the memory cell, but a memory cell including a PN diode as a load which is connected such that a reverse bias is applied to the diode can be used with the same effects as described above.

Furthermore, a current switch for giving a base voltage to the word line driving transistor from an address output signal may comprise any type having the required function. The voltages of the two word lines may be determined arbitrarily if the voltage difference can be determined properly, and the method for driving the word line may be any type one such as one having a Darlington type word line driving transistor.

What is claimed is:

1. A semicondcutor memory device having a plurality of word line pairs and a plurality of drain lines, a plurality of bit line pairs, and a plurality of mmmory cells connected to both said word line pairs and said bit line pairs at cross points thereof, comprising:
   a first word line and a second word line being provided to form said word line pairs;
   each said memory cell including:
   a first transistor and a second transistor whose commonly connected emitters are connected to a said drain line
   a first resistor and a second resistor connected between the collectors of said first and second transistors and said first word line,
   the bases of said first and second transistors being connected to the collectors of said second and first transistors respectively, and
   a first diode being connected between the collector of said first transistor and said second word line and a second diode is connected between the collector of said second transistor and said second word line;
   a current switch provided in each row and utilizing;
   an input transistor for receiving an address input signal at its base input and a reference transistor for receiving a predetermined voltage at its base input, the emitters of said input transistor and said reference transistor being commonly connected with each other;
   a third resistor and a fourth resistor serially connected between the collector of said input transistor and a power supply voltage;
   a first word line driving transistor for driving said first word line, the base of said first word line driving transistor being connected between said third resistor and said fourth resistor, the emitter of said first word line driving transistor being connected to said first word line;

a second word line driving transistor for driving said second word line, the base of said second word line driving transistor is conencted to the collector of said input transistor and said fourth resistor, the emitter of said second word line driving transistor being connected to said second word line; and the collectors of said first and said second word line driving transistor being connected to said power supply voltage.

2. A seminconductor memory device as defined in claim 1, wherein a current source is provided and current extracting means for extracting a predetermined current from the memory cells which are connected to said drain line, which memory cells include a selected memory cell connected to all of said drain lines.

3. A seminconductor memory device as defined in claim 2, wherein said current extracting means comprises a diode connected to said drain line of each row and a current source is commonly connected to all of said diodes.

4. A seminconductor memory device as defined in claim 2, wherein said current extracting means comprises a first current extracting transistor provided at each row, the collector of said first current extracting transistor is connected to said drain line of each said row, a second current extracting transistor provided at each said row, the base of said second current extracting transistor is connected to said second word line of each said row, the collector of said second current extracting transistor is connected to said power supply means, and the emitter of said second current extracting transistor is connected to the base of said first current extracting transistor of each said row, a first current extracting current source at each said row connected to the emitter of said second current extractin transistor of said row, and a second current extracting current source connected to all the emitters of said first current extracting transistors.

5. A semiconductor device as defined in claim 1, wherein said first and second transistors are multi-emitter transistors.

6. A semiconductor device as defined in claim 1, wherein said first and second diodes are Schottky barrier diodes.

7. A semiconductor memory device having a plurality of word line pairs and a plurality of drain lines, a plurality of bit line pairs, and a plurality of memory celss connected to both said word line pairs and said bit line pairs at cross points thereof comprising:

a first word line and a second word line provided to form each said word line pairs;

each said memory cell including:
a first transistor and a second transistor whose commonly connected emitters are connected to a said drain line, a first resistor and a second resistor connected between the collectors of said first and second transistors and said first word line respectively, the bases of said first and second transistors being connected to the collcctors of said second and first transistors respectively, and a first diode being connected between the collector of said first transistor and said second word line and a second diode is connected between the collector of said second transistor and said second word line;

a current switch being provided in each row and including:
an input transistor for receiving an address input signal at its base input and a reference transistor for receiving a predetermined voltage at its base input, the emitters of said input transistor and said reference transistor being commonly connected with each other;

a third resistor is provided between the collector of said input transistor and a power supply voltage;

a word line driving transistor for driving said word lines, the base of said word line driving transistor being connected to the collector of said input transistor and the emitter of said word line driving transistor being connected to said first word line;

word line load means being provided between said first word line and said second word line; and the collector of said word line driving transistor being connected to said power supply voltage.

8. A semiconductor memory device as defined in claim 7, wherein said word line load means comprises a resistor.

9. A semiconductor memory device as defined in claim 7, wherein said word line load means comprises a resistor and a diode being connected in parallel.

10. a semiconductor memory device as defined in claim 7, wherein a current source is provided and current extracting means for extracting a predetermined current from the memory cells which are connected to said drain line, which memory cells includes a selected memory cell connected to all of said drain lines.

11. A seminconductor memory divide as defined in claim 10, wherein said current extracting means compises a diode connected to said drain line of each row and a current source connected to all of said diodes.

12. A semiconductor memory device as defined in claim 10, whrein said current extracting means comprises a first current extracting transistor provided at each row, the collector of said first current extracting transistor is connected to said drain line of each said row, a second current extracting transistor provided at each said row, the base of said second current extracting transistor is connected to said second word line of each said row, the collector of said second current extracting transistor is connected to, said power supply means, and the emitter of said second current extracting transistor is connected to the base of said first current extracting transistor of each said row, a first current extracting current source at each said row connected to the emitter of said second current extracting transistor of each said row, and a second current extracting current source connected to all the emitters of said first current extracting transistors.

13. A semiconductor device as defined in claim 7, wherein said first and second transistors are multi-emitter transistors.

14. A semiconductor device as defined in claim 7, wherein said first and second diodes are Schottky barrier diodes.

* * * * *